US005790626A

United States Patent [19]
Johnson et al.

[11] Patent Number: 5,790,626
[45] Date of Patent: Aug. 4, 1998

[54] BI-DIRECTIONAL LINEAR FEEDBACK SHIFT REGISTER

[75] Inventors: David J. Johnson, Ft. Collins; Daniel J. Dixon, Thornton, both of Colo.

[73] Assignee: Hewlett-Packard Company, Palo Alto, Calif.

[21] Appl. No.: 711,775

[22] Filed: Sep. 10, 1996

[51] Int. Cl.$^6$ .................................. G11C 19/00
[52] U.S. Cl. .................................. 377/69; 377/81
[58] Field of Search .................................. 377/69, 81

[56] References Cited

U.S. PATENT DOCUMENTS 5,282,234  1/1994  Murayama et al ................... 377/69

OTHER PUBLICATIONS

IBM Tech Disc Bul vol. 27 No. 10A pp. 5718–5720 "Ring shifter with externally selectable Modulus" Mar. 1985.

*Primary Examiner*—Margaret Rose Wambach
*Attorney, Agent, or Firm*—Edward L. Miller

[57] ABSTRACT

A unified bi-directional LFSR is fabricated from latches having dual (Forward and Reverse) inputs. Each such latch accepts its inputs upon receipt of a clock signal that is respectively associated with the forward or reverse direction. The appropriate collection of XOR gates exists between latch outputs and the inputs associated with a forward clock signal, so as to produce the forward sequence. Likewise, another appropriate collection of XOR gates exists between the latch outputs and the inputs associated with the reverse clock signal. To produce a "reverse" LFSR corresponding to the polynomial that is the reciprocal of the polynomial for the "forward" LFSR, the latches of the reciprocal (reverse direction) LFSR are construed as being numbered in the opposite order. That is, a single set of latches (register) has both a forward linear feedback network and a reverse linear feedback network. Only one of these two feedback networks is used at a time, but they can intermix forward and reverse steps and appear to index back and forth along the native sequence of the LFSR. That is, steps in reverse undo the most recent forward steps, and vice versa. The bi-directional LFSR is also equipped with a way to preset the latches to a preselected initial value, and it is compatible with the production of all zeros. This last feature is obtained by including an extra latch in the register [(n+1)-many latches for a desired n-many bit word] and using it as a valid bit to qualify as correct the remaining latches in the register.

2 Claims, 11 Drawing Sheets

BI-DIRECTIONAL LINEAR FEEDBACK SHIFT REGISTER

BACKGROUND OF THE INVENTION

Linear feedback shift registers (LFSR's) are useful in many applications, particularly those where pseudo random digital numbers are required. Because of their usefulness and simplicity they have been well studied, and many texts have been written concerning the design of LFSR's. See, for example, *BUILT-IN TEST FOR VLSI: Pseudorandom Techniques* by Bardell, McAnney and Savir, published in 1987 by John Wiley & Sons, Inc., ISBN 0-471-62463-2. As its name suggests, an LFSR starts out as does a shift register: an ordered collection of latches interconnected so as to propagate each bit in a cell to an adjacent cell. In an LFSR the input to the latch for a bit generally comes from an adjacent cell, or is otherwise derived from a combination of bits in other cells. In this, it may somewhat resemble a circular shift register having no separate "data input" to be regularly received and stored while shifting that data for a delayed presentation at an "output"; a circular shift register simply recirculates its contents. Unlike a standard shift register, however, an LFSR includes combinational logic at various places along the shift register that modify the content as it is shifted into the latches corresponding to those various places. This is how LFSR's can generate pseudo random patterns. It is typical for the combinational logic to be no more complicated than one or more exclusive OR (XOR) gates strategically placed in the path of the bits as they go from certain latches to their successors in the ordering thereof in the register.

A polynomial notation has been devised to symbolically describe various LFSR configurations, and the properties of these have been set out both in the form of theorems and tables generated by computer simulation. Various properties, such as maximal length sequences and different types of distribution, have all been investigated and the results available in the texts describing LFSR's. A maximal length cycle for an n-bit LFSR is one that has $2^n-1$ different values; one of the usual $2^n$ values for n bits is generally excluded from consideration. The excluded value is ordinarily all zeros.

Let us now briefly leave LFSR's for another topic: built-in self test for a digital mechanism, especially one that is fabricated as a VLSI chip, and most especially one that includes some on-board memory. There is already an extensive collection of knowledge concerning how to test memory to ensure that it does what it is supposed to do, and does not do what it is not supposed to. For our purposes we may note that a mechanism for generating a sequence of addresses is needed, and that it is extremely desirable that such an address generator be able to produce its sequence in exact reverse order when it is desired to do so. This exact reversibility is important to the various algorithms that test the memory; the detection of certain classes of errors relies upon such a capability. It generally does not matter just what the "forward" sequence is, so long as the "reverse" sequence is an exact reverse ordering of the forward sequence, and that all possible values are represented in each sequence.

Up-down reversible counters have frequently been used to generate such addresses. Let us simply note that they consume a lot of combinational logic between their bits, and thus a lot of space on the chip. It is also noted that self test circuitry does not contribute to a chip's principal functionality, which functionality is the reason why the chip exists in the first place. Thus it is that there is often considerable sentiment in favor of reducing the space on a chip needed for the self test circuits.

To be sure, LFSR's have been variously employed in the service of built-in self test mechanisms. However, as attractive as they are for some things, certain warts, as it were, have heretofore limited their applicability to the testing of memory. First, unless some "extra circuitry" is added, LFSR's do not produce all zeros as an output value in their sequence of values. As warts go this is a small one, and has already been solved with a reasonable solution. However, getting the LFSR to go in exact reverse order is a BIG wart. In an at least one known instance a designer contemplated two entirely separate LFSR's, where one was the "reciprocal" of the other (it is known how to write the reciprocal polynomial from a given polynomial), and a collection of MUX's to select between them. This approach, however, was discarded when it was discovered that a straight up-down counter had a smaller parts count.

It would be desirable if the simplicity of the LFSR could be retained while adapting it to have both a forward and an exact reverse mode of operation. We shall term such an LFSR a bi-directional LFSR. Such an adaptation should be compatible with the production of all zeros.

SUMMARY OF THE INVENTION

A solution to the problem of constructing a unified (single) bi-directional LFSR (as opposed to the MUX'ed dual LFSR idea) is to fabricate the LFSR from latches having dual inputs, say Forward inputs and Reverse inputs. Each such latch accepts its inputs upon receipt of a clock (or perhaps LOAD) signal that is respectively associated with the forward or reverse direction: e.g., FCLK and RCLK for "forward clock" and "reverse clock", respectively. The appropriate collection of XOR gates exists between latch outputs and the inputs associated with FCLK, so as to produce the forward sequence. Likewise, another appropriate collection of XOR gates exists between the latch outputs and the inputs associated with RCLK. However, in order to produce a "reverse" LFSR corresponding to the polynomial that is the reciprocal of the polynomial for the "forward" LFSR, it is necessary (as is known) to construe the naming of the output bits of the reciprocal (reverse direction) LFSR as being numbered in the opposite order. That is, the old LSB is now the new MSB, old MSB is now the new LSB, and so on for all named output bits in between.

It may be useful to think of it this way: Instead of two separate registers with MUX's to select between the two sets of outputs, the two registers share the same dual input latches, so that there is really only one register. This single set of latches (register) has both a forward linear feedback network and a reverse linear feedback network. Only one of these two feedback networks is used at a time. If it helps, think of the latches as being numbered one way during forward, and the opposite way during reverse.

Not only does the bi-directional LFSR described above have forward and reverse sequences that are exactly opposite, it can intermix forward and reverse steps and appear to index back and forth along the native sequence of the LFSR. That is, steps in reverse undo the most recent forward steps, and vice versa, just as for a reversible (up-down) counter.

The bi-directional LFSR is also equipped with a way to preset the latches to a preselected initial value, and it is compatible with the production of all zeros. This last feature is obtained by including an extra latch in the register [(n+1)-many latches for a desired n-many bit word] and using it as a valid bit to qualify (as if it were an output strobe) the remaining latches in the register.

If addresses for a test of memory are not of interest, this technique may be used to provide a reversible sequence of pseudo random numbers. Also, dual input latches are a convenience, but not a necessity. The latches may be of the single input type, and the separate clocking used to enable gating that selects which linear feedback network is allowed to drive that single input of each latch.

On the other hand, each latch in the single register may have several inputs, and not just for forward and reverse instances of a particular sequence. They could as well be for sequence #1, sequence #2, and so on, up to sequence #n. Each sequence would have its own associated linear feedback network. Some of these might be the exact opposite sequence of the others, but perhaps not; they could simply be different useful sequences.

DESCRIPTION OF A PREFERRED EMBODIMENT

Figure 1:
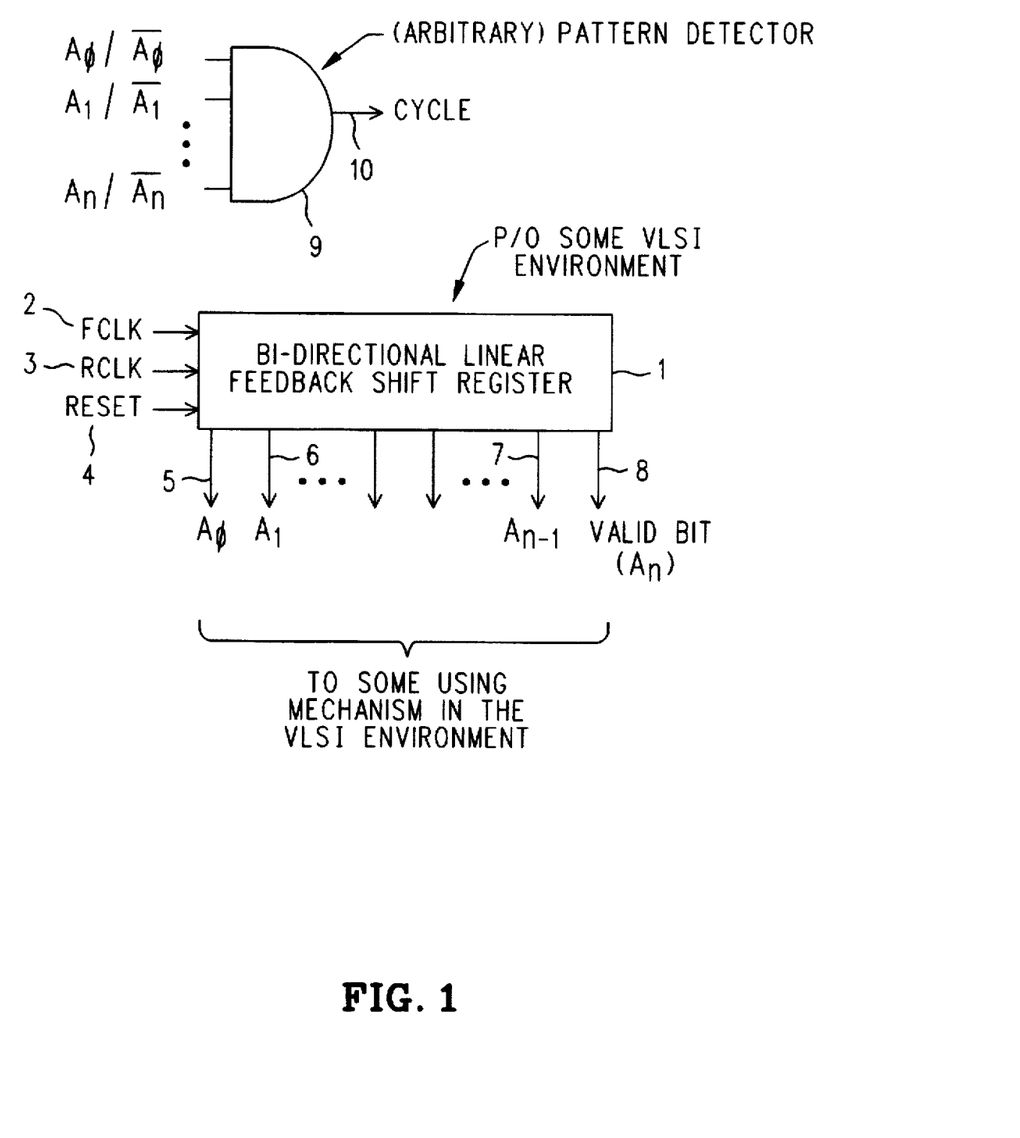
FIG. 1 is a simplified block diagram of the relationship between a bi-directional LFSR used as an address generator for built-in memory self test in a VLSI chip.

Refer now to FIG. 1, wherein is shown a simplified block diagram of a Bi-directional LFSR 1 that is part of some VLSI environment (not itself shown, but which could be a microprocessor). In the instant case the reason for having the bi-directional LFSR 1 is as part of a memory self test mechanism. To this end the output bits $A_0 5, A_1 6 \ldots A_{n-1} 7$ are an n-bit address that is valid (useable) whenever a Valid Bit (really $A_n$) is true. We have not shown any particular using mechanism, but will be appreciated that it could, for example, be a state machine whose function is to test an on-board memory, such as a cache memory in a microprocessor. The bi-directional LFSR 1 may be put into some preselected initial state (values for the various output bits) by exerting the RESET signal 4. Those familiar with LFSR's will appreciate that, while otherwise arbitrary, that initial value will probably not be all zeros. Inside the LFSR the signal RESET 4 goes to each latch within the register and causes each such latch to be either set or cleared, as appropriate for that bit position of the initial value. Those familiar with LFSR's will appreciate that, while otherwise arbitrary, that initial value will probably not be all zeros.

Each latch in the LFSR 1 is a dual input latch, which means that, aside from the reset function, each latch has an input that is enabled only upon receipt of an associated signal. One of these signals is FCLK 2, for forward clock. FCLK 2 enables the input of each dual latch that is associated with the rule (think "linear feedback network") that is associated with a state change (think "step", "index", "increment" or "count") in the forward direction. In the same way, RCLK 3 (for reverse clock) enables the other input of each dual input latch. The other inputs are associated with an reciprocal feedback network that produces state changes in the reverse direction.

In the usual and conventional fashion for describing LFSR's, we adopt the IBM style where bit zero is the most significant bit, and bit n is the least significant bit.

The Valid Bit 8 is, in the present example, simply the very least significant bit $A_n$ 8. (Later on it will become clear that the Valid Bit could be any of the (n+1) bits. For now it is perhaps easiest to accept the LSB 8 as being the Valid Bit.) As far as the LFSR 1 itself is concerned, it is an (n+1)-bit register of maximal length sequence. That maximal length sequence does not, however, include and output word (address) of all (n+1) zeros. It does include an output of n-many most significant zeros with a value of one for $A_n$ 8. The maximal length sequence does include all other possible values for the (n+1)-many bits $A_0$–$A_n$. Hence, the subsequence obtained by taking the n bits $A_0$–$A_{n-1}$ with $A_0$ as a Valid Bit produces all possible values of those n-bits, with no duplicates.

The RESET signal 4 may set the (n+1)-many bits $A_0$–$A_n$ to 000 ... 001, which has the effect of making the starting value in the sequence for the n-bit output words ($A_0$–$A_{n-1}$) be all zero.

Also shown in FIG. 1 is an AND gate 9 having as inputs some arbitrary pattern drawn from the true and complement outputs from the bi-directional LFSR 1. All n+1 bits are represented. The output of the pattern detector 9 is a signal CYCLE 10 which is true once per complete cycle of a maximal length pattern. CYCLE 10 is of interest to the mechanism that controls the bi-directional LFSR 1 as part of some test regime. The duration of the signal CYCLE 10 will, of course, depend upon how long that value is allowed to remain in place. The purpose of CYCLE 10 is to indicate that a complete traverse of a maximal length sequence has been achieved. Suppose that the output pattern chosen for a RESET is the same as that represented by CYCLE. Then the application of RESET 4 would produce CYCLE 10. However, that instance of CYCLE 10 would be ignored as being immediately subsequent to a RESET. The next instance of either FCLK 2 or RCLK 3 would cause CYCLE 10 to go false. Assuming no RCLK's that outnumber FCLK's (or vice versa), CYCLE 10 will remain false until the end of the sequence is reached, at which time it will again go true.

Now, if one knew for sure that FCLK's and RCLK's were not going to be intermixed, one could also count how many have been issued after the latest RESET 4. Achieving the final count would have the same effect as the reappearance of CYCLE 10. The actual final count needed will vary as a function of the sequence in use, since almost exactly half of the total output values are not valid, and where in the overall sequence the last valid one falls can not be foretold in general. If FCLK and RCLK were to be intermixed, then the occurrence of one of those would count up toward the final count, and occurrence of the other would count back down.

Whether one uses CYCLE 10 or the terminal count in a counter, the assumption to this point is that, once a test is begun the clock signals of interest (FCLK 2 and RCLK 3) are simply allowed to free run or be individually issued at some convenient rate. Because of the random intermixing of valid and non valid output values, there is no enforceable correspondence between say, ten consecutive instances of FCLK 2 and the next ten consecutive valid outputs; there may have been (probably were) some non valid states in the output. To insist that each instance of the applied clock (2, 3) produce a next valid value in the sequence is another matter. It can be done, but a small amount of extra logic is required to enforce a rule for determining if extra cycles of the clock are needed to produce a next valid output value.

The needed rule is this. If the Valid Bit is true after the issuance of a clock cycle (2, 3), then the LFSR 1 has produced the next valid value in the sequence. However, if the Valid Bit is not true after the clock cycle is given then another clock cycle needs to be issued, and the rule re-applied.

Figure 2:
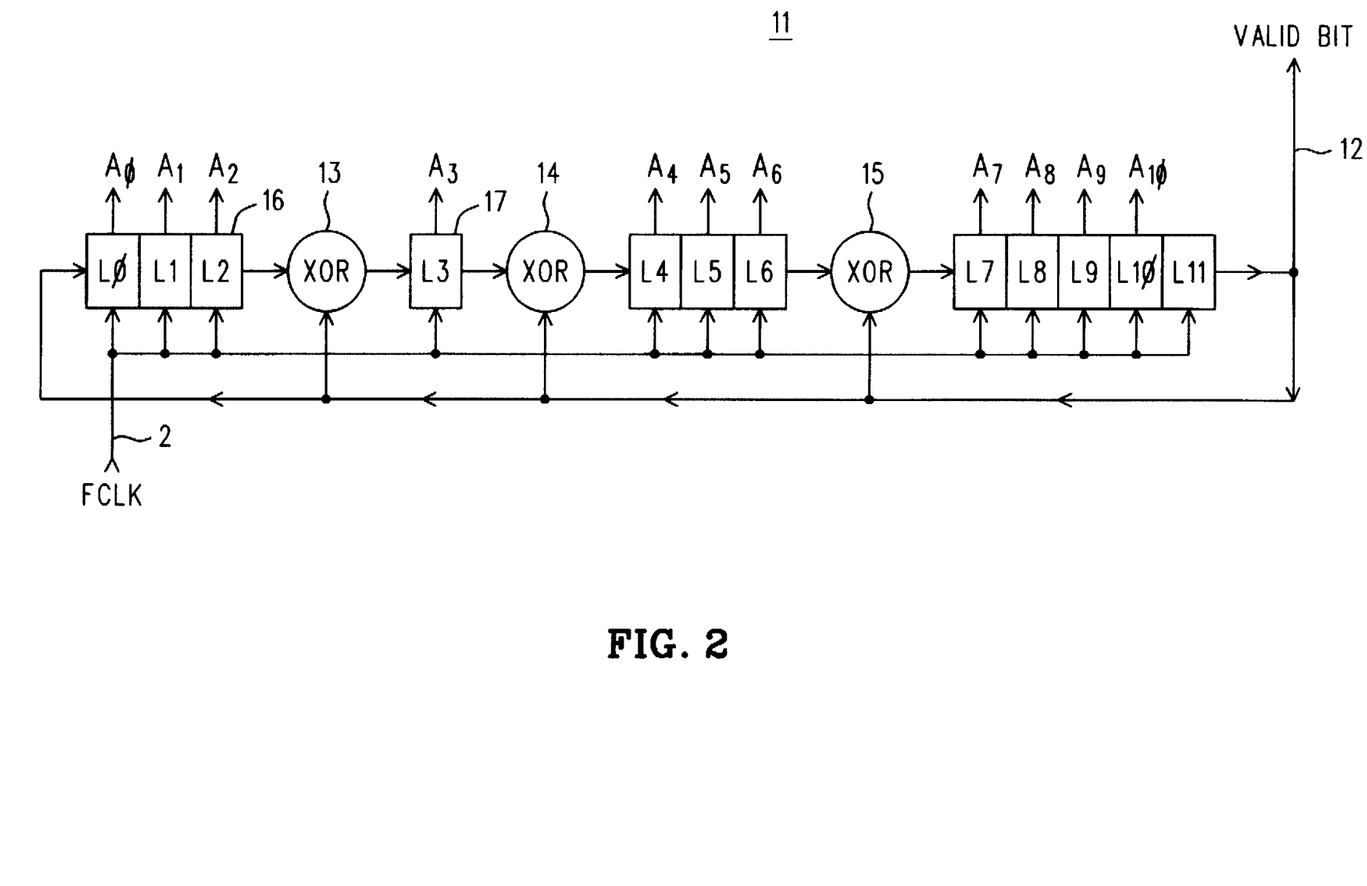
FIG. 2 is a simplified block diagram of a particular LFSR that generates a desired forward address sequence of eleven bit addresses for memory self test in a VLSI environment.

Refer now to FIG. 2, wherein is shown a simplified schematic 11 of a twelve-bit unidirectional LFSR with Valid Bit 12 for producing from FCLK 2 a desired sequence according to the polynomial:

$$P(x)=x^{12}+x^{7}+x^{4}+x^{3}+1 \qquad \text{Eq. (1)}$$

The eleven output bits are $A_0$ through $A_{10}$, and what would otherwise be $A_{11}$ is the Valid Bit 12. The LFSR is constructed of twelve identical latches, of which 16 and 17 are representative. Where latches adjoin one another, as for latches L0–L2, it is to be understood that the output of each latch on the left is shifted without alteration directly into its neighbor on the right. In the remaining cases an XOR gate (13, 14 and 15) modifies the shifted bit value according to the bit on the left and the value of the bit being returned into latch L0 from latch L11. Shifting occurs when FCLK 2 is issued. There is assumed to be (but is not shown) a RESET function that forces the various latches to assume a preselected value, which in this example is 000 000 000 001.

Figure 3:
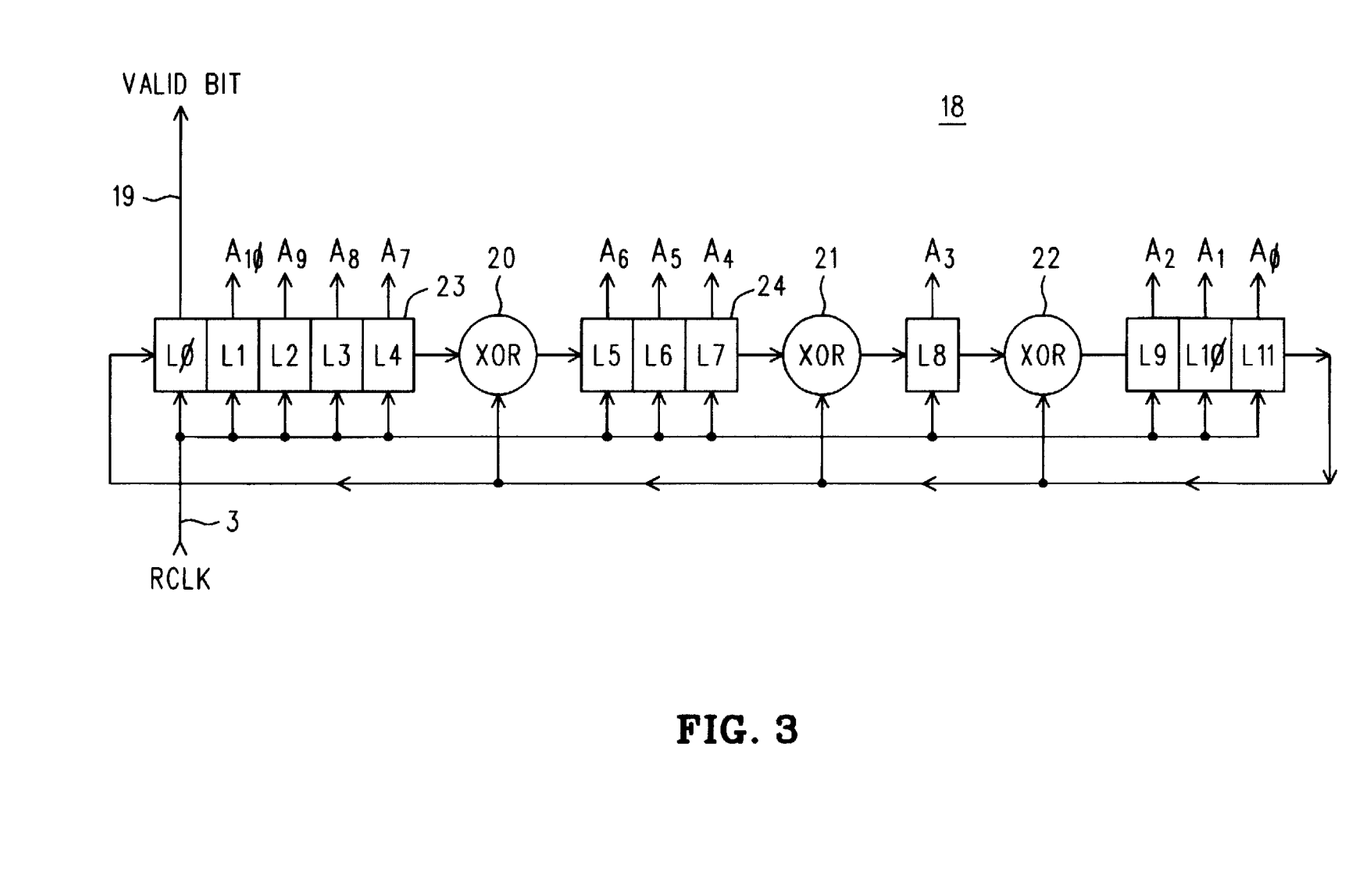
FIG. 3 is a simplified block diagram of an reciprocal LFSR that generates an address sequence of eleven bit addresses that would be the exact reverse of that for the LFSR of FIG. 2, except that the bits are in the wrong order of significance.

Refer now to FIG. 3, wherein is shown a simplified schematic 18 of a twelve-bit unidirectional reciprocal LFSR with Valid Bit 19 for producing from RCLK 3 an "anti-sequence" according to the reciprocal polynomial:

$$P^*(x)=x^{12}+x^{9}+x^{8}+x^{5}+1 \qquad \text{Eq. (2)}$$

The LFSR is constructed of twelve identical latches, of which 23 and 24 are representative. Where latches adjoin one another, as for latches L0–L4, it is to be understood that the output of each latch on the left is shifted without alteration directly into it neighbor on the right. In the remaining cases an XOR gate (20, 21 and 22) modifies the shifted bit value according to the bit on the left and the value of the bit being returned into latch L0 from latch L11. Shifting occurs when RCLK 3 is issued. There is assumed to be (but is not shown) the identical RESET function that forces the various latches to assume the same preselected values as they do for the RESET of FIG. 2.

As before, the eleven output bits are $A_0$ through $A_{10}$, and what would otherwise be $A_{11}$ is the Valid Bit 19. The problem is that the anti-sequence of the LFSR for the polynomial of Eq. (2) is not the exact reverse of the sequence of the LFSR of FIG. 2. To obtain that the ordering of the bits needs to also be reversed. That is, the role of the bits in latches L0 and L11 needs to be interchanged, as does that of the bits latches L1 and L10, latches L2 and L9, and so on. That is, it is necessary to re-associate the Valid Bit and named address bits with the latches. Once that is done, we may assert that the sequence of Valid Bit 19 and address bits $A_0$–$A_{10}$ for the LFSR of FIG. 3 is indeed the exact reverse of the sequence for the LFSR of FIG. 2. Now we have a new problem: whether the output of, say, latch L9 is $A_9$ or $A_2$ depends on how we are using the LFSR. What to do to avoid MUX's on the outputs?

Figure 4:
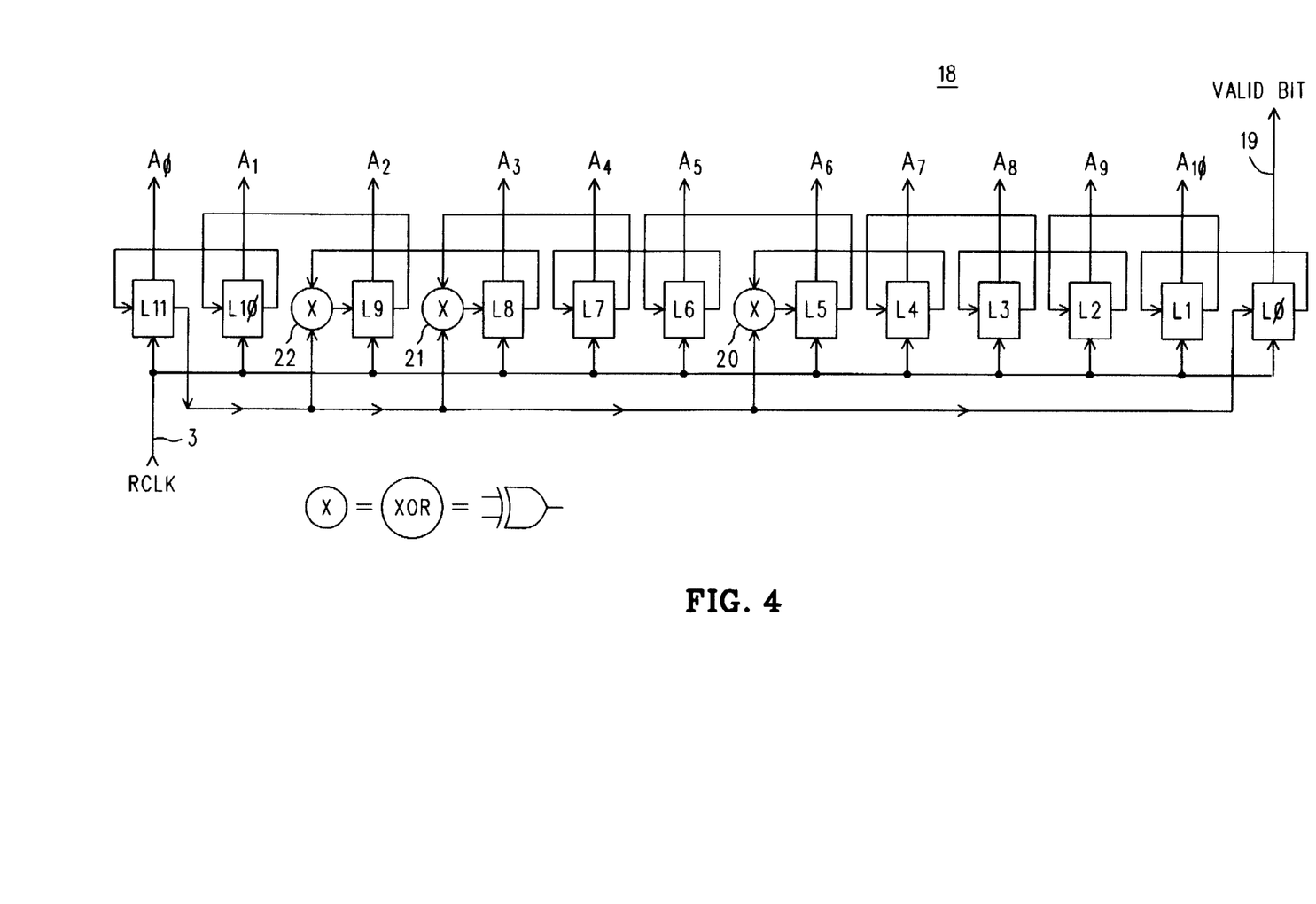
FIG. 4 is a simplified block diagram of an reciprocal LFSR with re-ordered bits that generates an address sequence of eleven bit addresses that is the exact reverse of that for the LFSR of FIG. 2.

First, let us redraw the circuit 18 of FIG. 3 as it is shown in FIG. 4. All that has been done is to re-order the latches L0–L11 such that the Valid Bit 19 and the named address bits $A_0$–$A_{10}$ match up with the ordering of FIG. 2.

Now compare FIG. 2 with FIG. 4 and ask "What is so special about the latches?" They are named differently and they are interconnected differently. The different naming is not a structural difficulty. Next, one common set of dual input latches could be interconnected both ways at the same time, so long as we take care to use the first type of latch inputs for, say the forward linear feedback interconnections between the latches, and the other type of latch inputs for the reverse linear feedback interconnections. This "merging" of FIGS. 2 and 4 produces the schematic 25 shown in FIGS. 5A–5C.

Figure 5A:
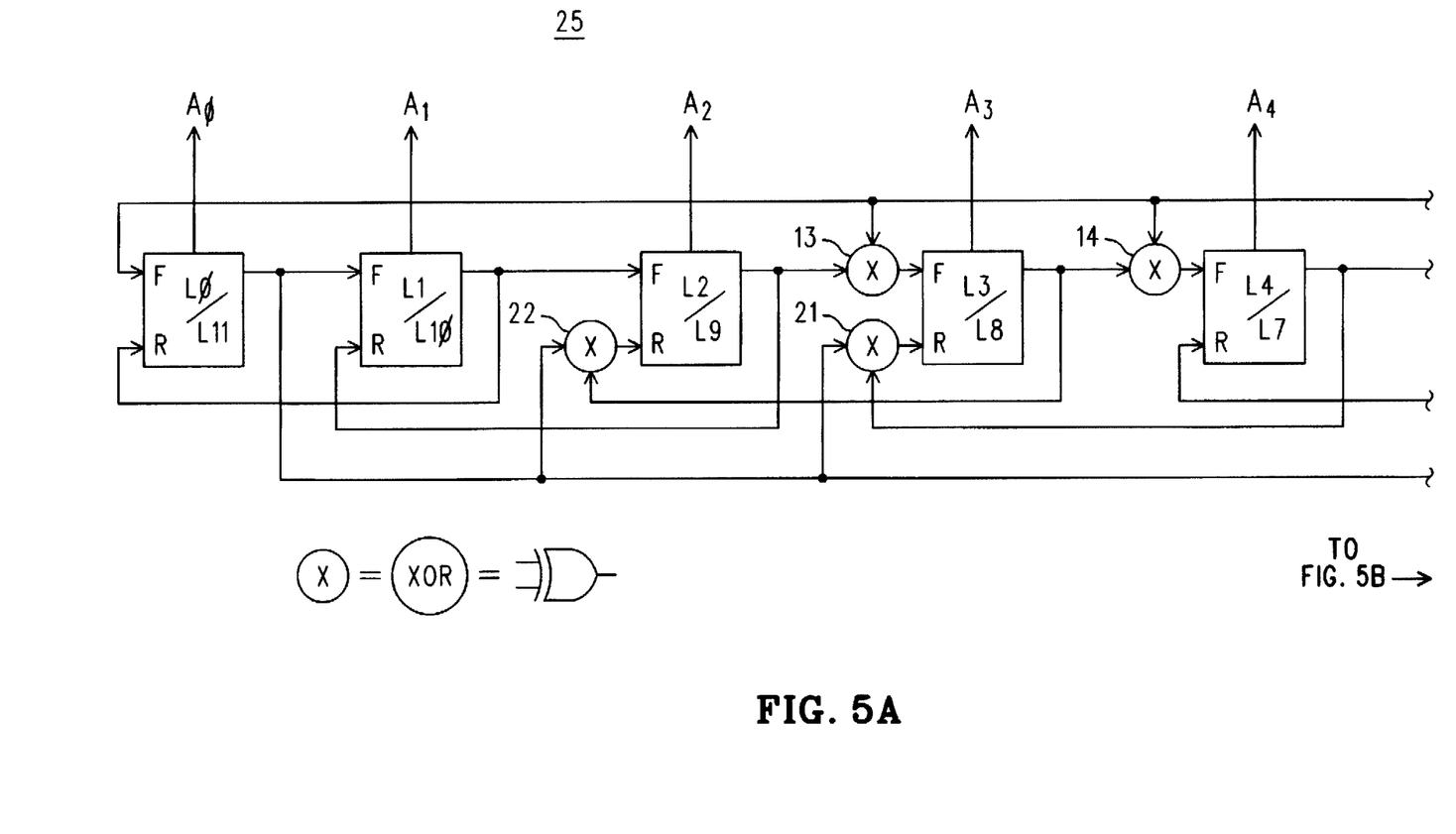
FIGS. 5A–5C are a simplified block diagram of a unified bi-directional LFSR that combines the sequences of the LFSR's of FIGS. 2 and 4.
Figure 5B:
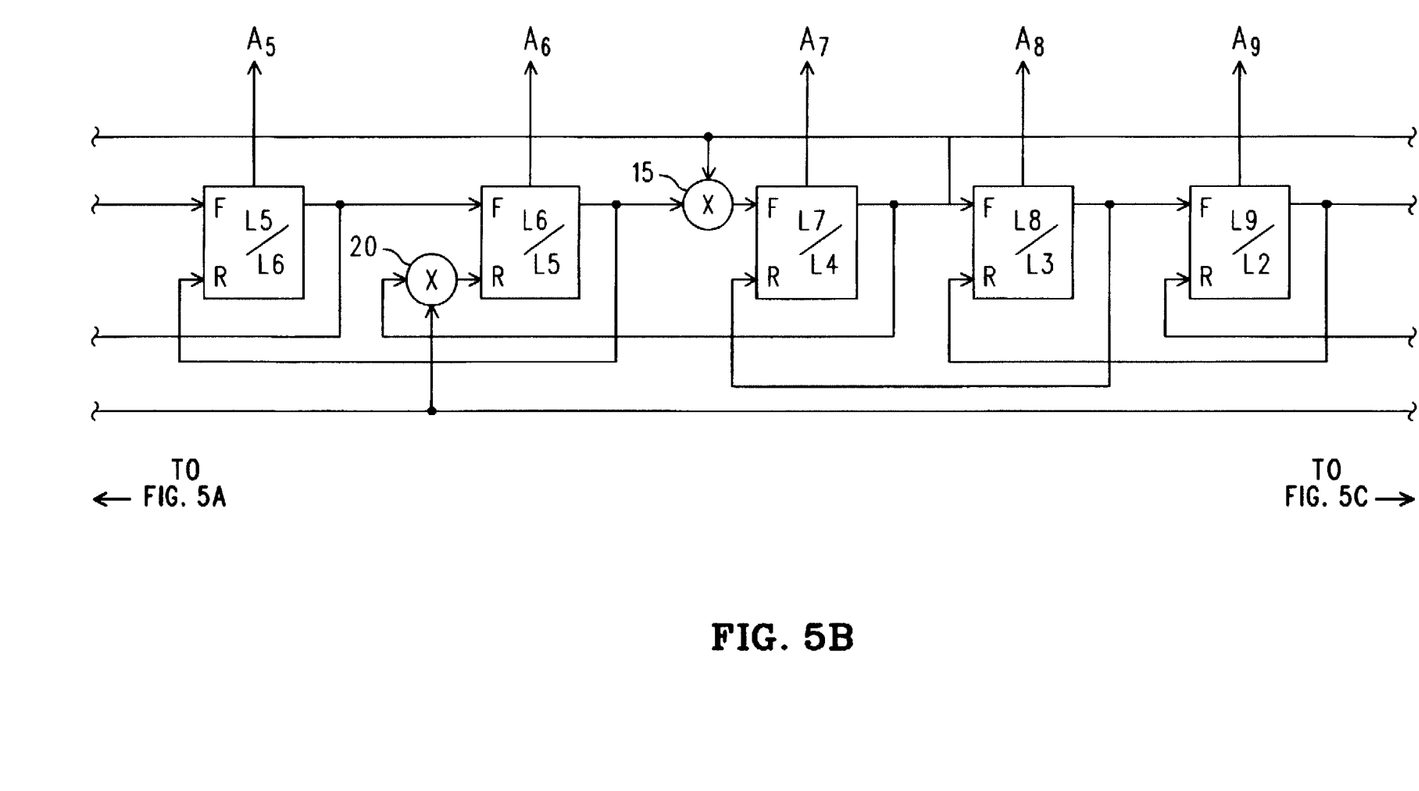
Figure 5C:
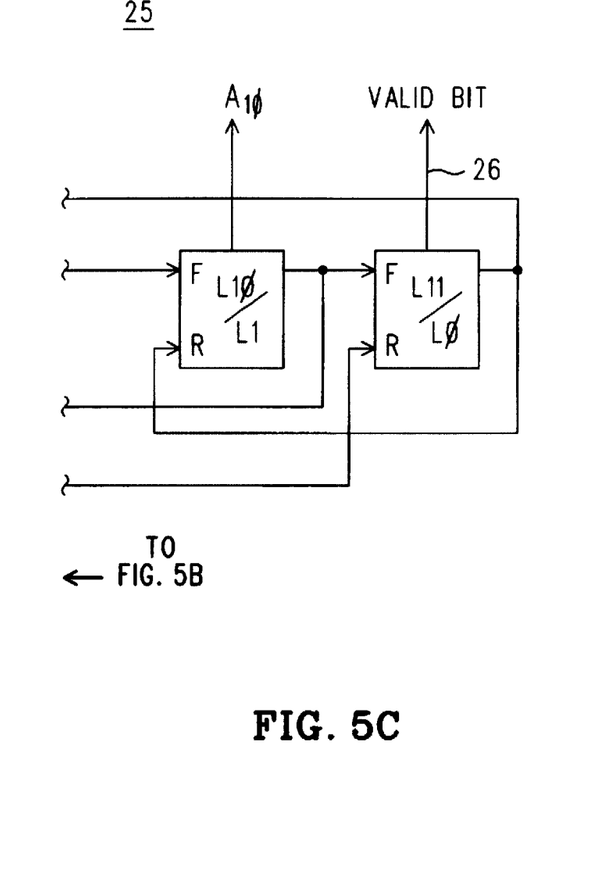

For the sake of brevity, we have omitted the signals RESET 4, FCLK 2 and RCLK 3 from the figure. Exactly how these operate with a dual input latch as is shown in FIGS. 5A–5C will be illustrated in FIG. 6. For now, it will be understood that the F input to each latch L0/L11 through L11/L0 is an input active when FCLK 2 is issued and is interconnected with the forward linear feedback network of FIG. 3. Likewise, the R inputs are active when RCLK 3 is issued, and are interconnected with the reverse linear feedback network of FIG. 4. Thus, the latches L0/L11 through L11/L0 do double duty, as it were, and the named outputs $A_0$–$A_{10}$ and the Valid Bit 26 remain fixed. Note the XOR gates; they have the same reference numerals as the corresponding XOR gates in FIGS. 2, 3 and 4.

Upon reflection, it will be appreciated that the original Valid Bit in FIG. 2 been taken from, say, latch L3, then the Valid Bit in FIG. 3 would have been chosen to be the output of latch L8. The Valid Bit in FIGS. 5A–5C would then be the output of latch L3/L8. The "$A_{xx}$" notation for the output bits would avoid (skip over) L3, L8 and L3/L8, and would expand to include L11, L0 and L11/L0, as appropriate.

Figure 6:
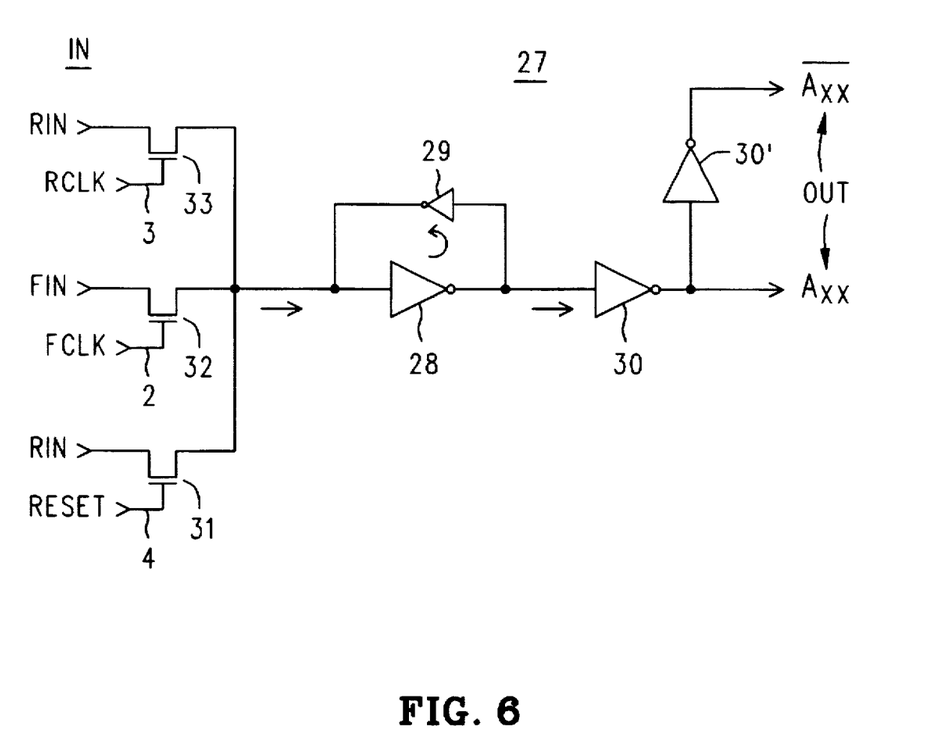
FIG. 6 is a simplified schematic of a dual input latch useful in fabricating the bi-directional LFSR of FIG. 4.

Refer now to FIG. 6, wherein is shown a simplified schematic diagram 27 of a dual input latch of the type used in FIGS. 5A–5C. The memory, or latching part of the latch itself is formed from a weak back-to-back positive feedback path for two inverters 28 and 29. Inverters 30 and 30' buffer the output and provide both logical senses, if needed.

The weak feedback from inverter 29 into 30 can be swamped by an input whenever its associated pass gate (31, 32 and 33) is on. Accordingly, the signal RESET 4 is applied to the gate of FET 31, to pass or not pass the value RIN (Reset Input). RIN will be either a fixed high or a fixed low, depending on the bit position for the latch. The signal FCLK 2 is applied to the gate of FET 32, to pass or not pass the value FIN. FIN is the output of the preceding latch or XOR gate in the feedback path for the forward linear feedback network. RCLK 3 and RIN have a similar relationship with FET 33 and the reverse linear feedback network.

Figure 7:
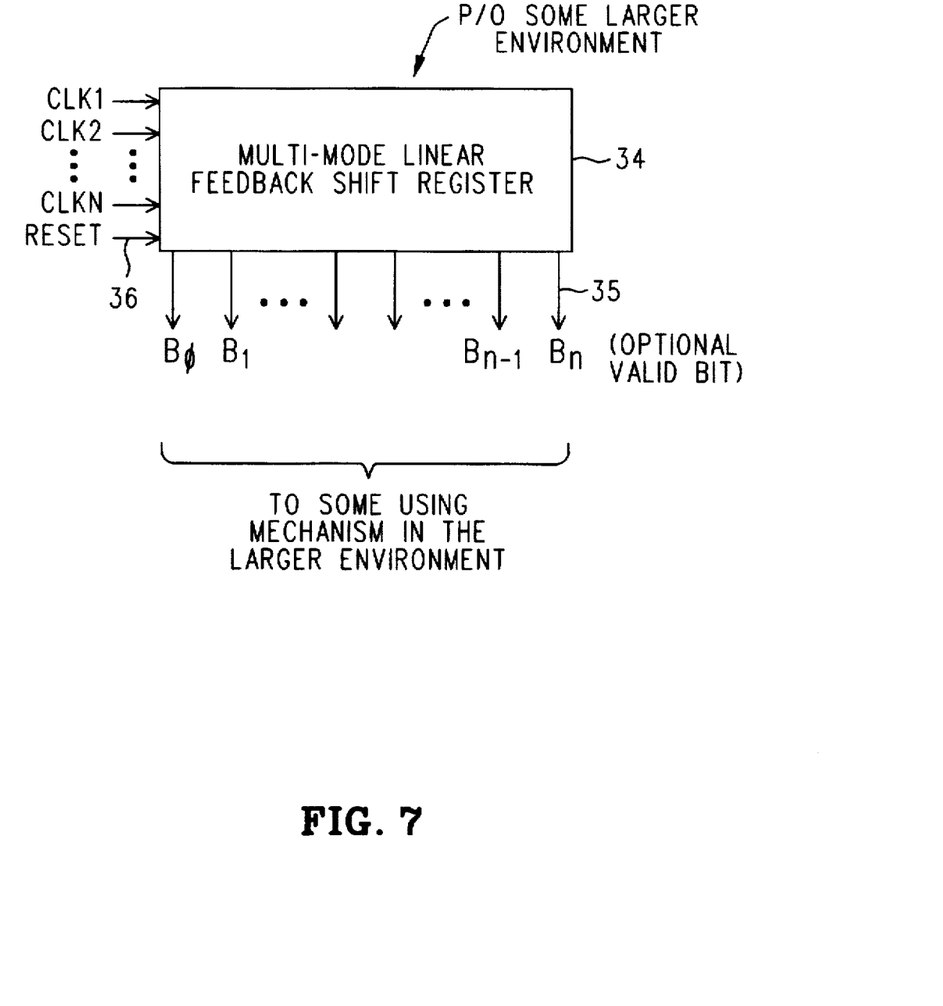
FIG. 7 is a simplified block diagram of a multi-mode LFSR useful as either an address or PRN generator.

Refer now to FIG. 7. It illustrates a generalization of the bi-directional LFSR 1 of FIG. 1. In particular, it shows a multi-mode LFSR 34 that is useful in some larger environment, which is not itself shown. Multi-mode LFSR 34 has n bits, of which outputs $B_0$ through $B_{n-1}$ are useable as an address, pseudorandom number, or whatever. Output bit $B_n$ is an optional Valid Bit 35. The multi-mode LFSR 34 responds to a RESET signal 36, and to a plurality of clock signals CLK1, CLK2, . . . CLKN, each of which cause the LFSR 34 to index one value in an associated mode whose rule of state-to-state transition is defined by a respectively associated linear feedback network. That is, if there are N-many such CLK signals, then there are N-many linear feedback networks, and the latches in the LFSR 34 are N-input latches. CLK1 might index according to a first pseudorandom sequence, while CLK2 indexes according to an entirely unrelated sequence. CLK3 might index exactly opposite the way of CLK4, and so on.

Figure 8:
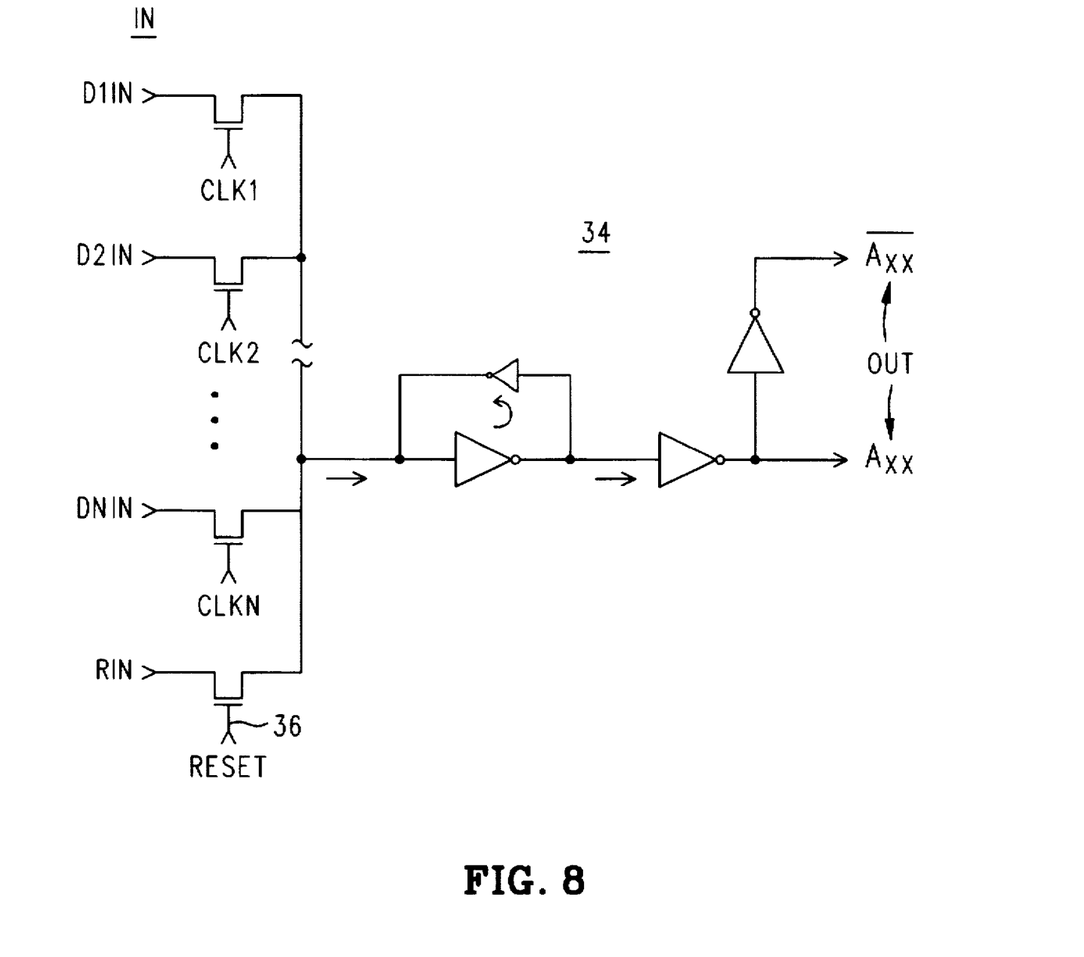
FIG. 8 is a simplified schematic of a multi-input latch useful in fabricating the multi-mode LFSR of FIG. 7.

Refer now to FIG. 8. It shows a generalized simplified schematic segment 34 for an N-input latch of the sort that would be used to implement the LFSR 34 of FIG. 7.

Figure 9:
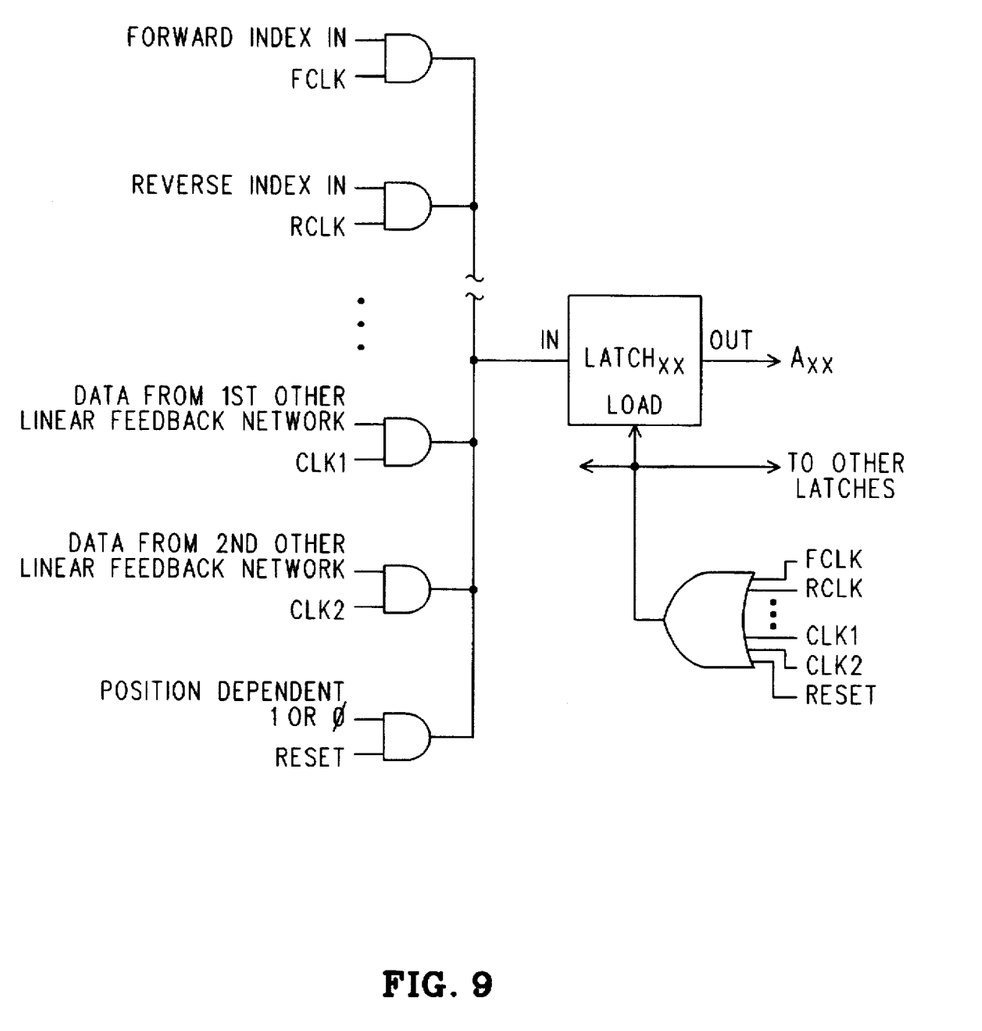
FIG. 9 is a simplified schematic of a way of fabricating bi-directional or multi-mode LFSR's while using off the shelf single input latches.

Finally, refer now to FIG. 9. It illustrates how the latches of a bi-directional or multi-mode LFSR would be interconnected if ordinary latches are to be used. Multiple input latches are fine for VLSI, but a designer who has to use prepackaged parts to be loaded onto a printed circuit board cannot be expected to have such a luxury at her disposal. What to do? One answer is to use lots of AND gates and an OR gate, as shown in the figure.

We claim:

1. A linear feedback shift register comprising:
   a collection of latches, each latch having an output, first and second control inputs, and first and second data inputs respectively active upon the presence of an associated signal at the corresponding first and second control input;

a first index signal coupled to the first control inputs of the latches in the collection thereof;

a second index signal coupled to the second control inputs of the latches in the collection thereof;

a first linear feedback network coupled to the outputs of the latches in the collection thereof, coupled to the first data inputs of the latches in the collection thereof, and producing a first sequence of values in the linear feedback shift register as instances of the first index signal are issued; and a second linear feedback network coupled to the outputs of the latches in the collection thereof, coupled to the second data inputs of the latches in the collection thereof, and producing a second sequence of values in the linear feedback shift register as instances of the second index signal are issued.

2. A linear feedback shift register as in claim 1 wherein the second sequence of values is the exact reverse of the first sequence of values.

* * * * *

UNITED STATES PATENT AND TRADEMARK OFFICE
CERTIFICATE OF CORRECTION

PATENT NO. : 5,790,626
DATED : August 4, 1998
INVENTOR(S) : David J. Johnson and Daniel J. Dixon It is certified that error appears in the above-identified patent and that said Letters Patent is hereby corrected as shown below:

In the Specification:

Column 3, Line 55:  Delete "$A_o5, A_16 \ldots A_{n-1}7$" and insert therefor --$A_o 5, A_1 6 \ldots A_{n-1} 7$-- (PTO's error)

Column 4, Line 4:  Delete "1is" and insert therefor --1 is-- (HP's error)

Column 4, Line 26:  Delete "and" and insert therefor --an-- (HP's error)

Signed and Sealed this

Eighth Day of May, 2001

Attest:

NICHOLAS P. GODICI

Attesting Officer    Acting Director of the United States Patent and Trademark Office